United States Patent [19]

Blanchard et al.

[11] Patent Number: 4,791,462
[45] Date of Patent: Dec. 13, 1988

[54] DENSE VERTICAL J-MOS TRANSISTOR

[75] Inventors: Richard A. Blanchard, Los Altos; Adrian I. Cogan, San Jose, both of Calif.

[73] Assignee: Siliconix Incorporated, Santa Clara, Calif.

[21] Appl. No.: 95,481

[22] Filed: Sep. 10, 1987

[51] Int. Cl.[4] ............................................. H01L 29/78
[52] U.S. Cl. .............................. 357/23.4; 357/23.12; 357/23.14; 357/22
[58] Field of Search ................. 357/23.4, 23.14, 23.12, 357/22 D, 22 E

[56] References Cited

U.S. PATENT DOCUMENTS

| 4,115,793 | 9/1978 | Nishizawa | 357/23.8 |
| 4,284,997 | 8/1981 | Nishizawa | 357/43 |
| 4,546,375 | 10/1985 | Blackstone et al. | 357/41 |
| 4,611,220 | 9/1986 | MacIver | 357/23.12 |

OTHER PUBLICATIONS

B. MacIver et al, IEEE Elect. Dev. Lettr, vol. EDL-5, No. 5, May 84, pp. 154-156 "j-MOS: A Versatile Power Field-Effect Transistor".

Primary Examiner—Andrew J. James
Assistant Examiner—Jerome Jackson, Jr.
Attorney, Agent, or Firm—Alan H. MacPherson; Brian D. Ogonowsky; Paul J. Winters

[57] ABSTRACT

A j-MOS structure is disclosed which operates at high current densities and provides high current handling capability. A heavily doped N+ substrate, acting as a drain, has grown on it a lightly doped N− epitaxial layer. Within the epitaxial layer are multiple N+ buried regions, each within a corresponding P+ buried region, and bisecting each of the multiple N+ regions are vertical gates extending from the upper surface of the epitaxial layer down into the N+ substrate. These gates are insulated from the epitaxial layer and substrate via a thin gate oxide layer, but are electrically connected to the multiple N+ buried regions. Between each adjacent gate pair, N+ source regions are formed on the upper surface of the epitaxial layer. The gates are connected together via a conductive layer which also electrically shorts the gates to a poly-Si contact making contact with the N+ buried regions. The N+ source regions between the gates are also electrically connected together via the conductive layer, but are insulated from the gates and P+ and N+ buried regions.

16 Claims, 4 Drawing Sheets (TOP VIEW)

DENSE VERTICAL J-MOS TRANSISTOR

BACKGROUND OF THE INVENTION

1. Field of the Invention

This invention relates to j-MOS transistors, which combine the features of both a JFET and a MOSFET, and in particular to an improved j-MOS transistor which operates at higher current densities.

2. Description of Prior Art

FIG. 1 shows a typical prior art j-MOS transistor as described in the article, "j-MOS: A Versatile Power Field-Effect Transistor", by B. A. MacIver et al., IEEE Elec. Dev. Ltrs., Vol. EDL-5, No. 5, May 1984, herein incorporated by reference. The j-MOS transistor in FIG. 1 includes substrate 10, insulation layer 15 formed over substrate 10, N+ source region 20, N+ drain region 21, N− channel 22, gate 25 formed over and insulated from channel 22 by gate oxide layer 24, and P+ region 23 formed in channel 22 and in electrical contact with gate 25. Metal contacts 26, 27, and 28 provide electrical contact to source region 20, gate 25, drain region 21, respectively. When gate 25 is at the source voltage (i.e., $V_{GS}=0$), current flows between source region 20 and drain region 21 through channel 22 as if the transistor was a JFET. When the gate voltage is positive with respect to the source voltage, but less than about 0.6 volts, an increased current flows between source region 20 and drain region 21 due to an accumulation of electrons in channel 22. The device is now behaving like a combined JFET and MOSFET. When $V_{GS}$ is greater than 0.6 volts, the P-N junction formed by P+ region 23 and N− channel 22 becomes forward biased, and the conductivity of the channel region is modulated by the injection of holes into the channel, thus further reducing the resistance of the channel. If P+ region 23 contained an N+ region electrically coupled to gate 25, and P+ region 23 was otherwise insulated from gate 25, P+ region 23 would not become forward biased, and the conductivity of the channel would be modulated due to an accumulation of electrons in N-channel 22.

When gate 25 is at a negative voltage with respect to source region 20 (i.e., $V_{GS}=-V$), the device behaves like a JFET with a reverse biased gate, and the electric field created between gate 25 and channel 22 decreases the number of free electrons in channel 22, thus increasing the ohmic resistance of channel 22. P+ region 23 acts to sink holes generated in channel region 22, thus keeping the device turned off. In an alternative embodiment, substrate 10 and insulation layer 15 may be replaced by an insulating substrate of sapphire.

A higher current variation of the j-MOS transistor has been proposed and investigated. This variation, shown in FIG. 2, uses N+ substrate 30 as a drain to form a vertical j-MOS transistor. In FIG. 2, N+ source regions 32, 33 are insulated from N+ substrate 30 by insulating regions 34, 35, respectively. N− channel 36 is formed between source regions 32, 33 and contacts substrate 30 via an opening between insulating regions 34, 35. P+ regions 37, 38 are formed in channel 36 and are in electrical contact with gate 39, which is formed over channel 36. Gate 39 is insulated from channel 36 via insulation layer 40 and is insulated from source metal contact 41 via insulation layer 42. This device performs similarly to that shown in FIG. 1, except that current flows from the source from both sides of gate 39, thus providing a greater cross-sectional area through which current can flow. Another difference is that current flows vertically through substrate 30. The j-MOS of FIG. 2 is difficult to fabricate due to the difficulty of forming single crystal silicon over $SiO_2$ regions 34, 35.

It is seen that prior art j-MOS devices require some lateral current flow through the channel. It is well-known that higher current densities (Amperes·$cm^2$) are obtained by reducing channel width, or otherwise reducing channel resistance, and that a higher current handling capability is obtained by increasing channel cross-sectional area. One limiting factor in achieving higher current handling capability is that the channel must be thin enough to be adequately depleted upon application of a preselected voltage to the gate. Vertical j-MOS transistors, such as that shown in FIG. 2, enable higher current densities, but channel thickness still remains a limiting factor to higher current handling capabilities.

SUMMARY

The present invention is a novel vertical j-MOS structure which operates at higher current densities, and provides higher current handling capabilities, than prior art j-MOS devices. In an interdigitated version of this device, two gates operate on each vertical channel, and, thus, the channels may be formed with a large cross-sectional area, enabling a higher current handling capability. Two gates per channel also enable the j-MOS to have a lower on-resistance. One embodiment of the invention includes a heavily doped N+ substrate, acting as a drain, having grown on it a lightly doped N− epitaxial layer. Within the epitaxial layer are multiple P+ buried regions and within each P+ buried region is an N+ buried region. Bisecting each of the multiple P+ and N+ regions is an associated vertical gate extending from the upper surface of the epitaxial layer down into the N+ substrate. These gates are insulated from the epitaxial layer and substrate via a thin gate oxide layer, but are electrically connected to the multiple N+ buried regions. Between each adjacent gate pair, N+ source regions are formed on the upper surface of the epitaxial layer. The gates are connected together via a conductive layer which also electrically shorts the gates to the N+ buried regions. The N+ source regions between the gates are also electrically connected together via the conductive layer but are insulated from the gates and P+ and N+ buried regions. This structure provides a direct vertical path between the multiple source regions and the drain. The multiple P+ regions act to sink undesired minority carriers (holes) in the channels when the j-MOS device is biased in its current blocking state, thus enabling the j-MOS device to more completely cut off current between the source and drain. If a closed cell approach is used, each channel region is completely surrounded by a P+ buried region, an N+ buried region, and a gate, also resulting in a relatively large channel cross-sectional area.

DETAILED DESCRIPTION OF THE PREFERRED EMBODIMENT

Figure 1:
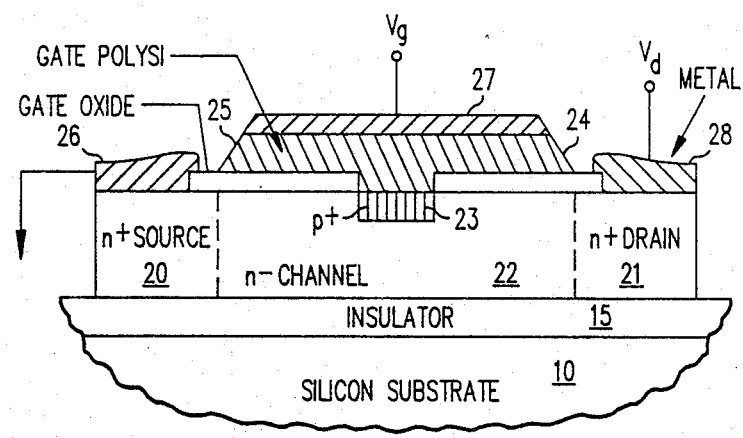
FIG. 1 shows a cross-section of a prior art lateral j-MOS transistor.
Figure 2:
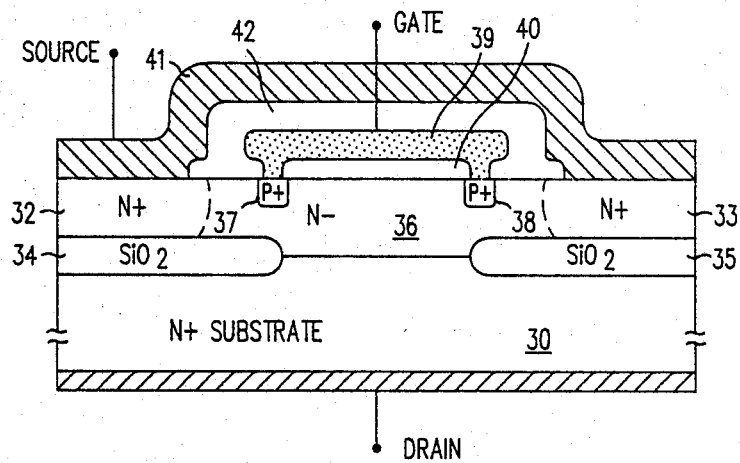
FIG. 2 shows a cross-section of a prior art vertical j-MOS transistor.
Figure 3:
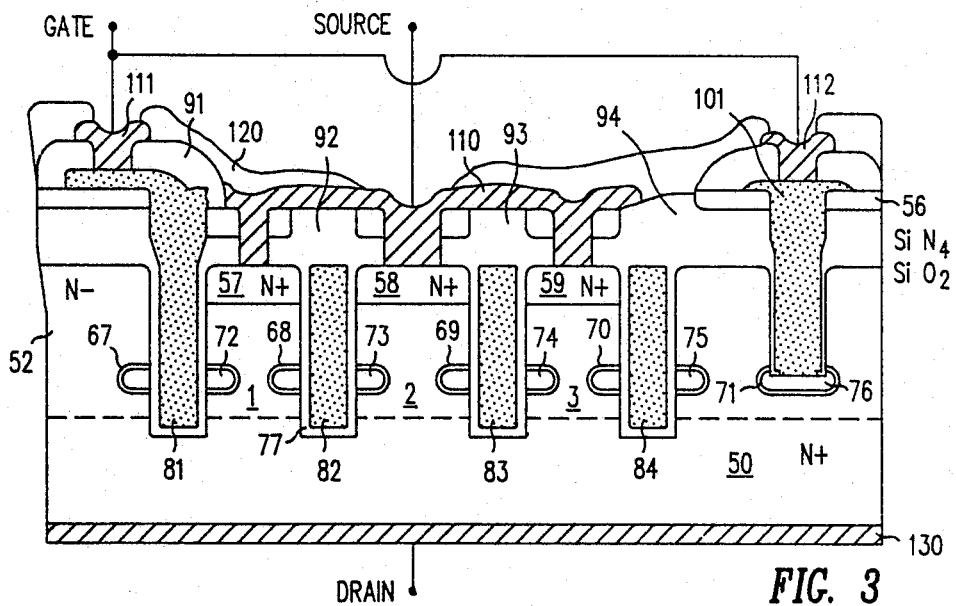
FIG. 3 shows a cross-section of a vertical j-MOS transistor in accordance with the preferred embodiment of this invention.

The preferred embodiment of the invention is shown in FIG. 3. Certain proportions have been exaggerated for legibility. A highly doped N+ substrate 50 acts as the drain for the device. Lightly doped N− epitaxial layer 52 overlies substrate 50. Multiple polycrystalline silicon (poly-Si) gates 81, 82, 83, 84, vertically situated in epitaxial layer 52 and substrate 50, define channel regions 1, 2, 3. P+ buried regions 67, 68, 69, 70, 71, formed so as to protrude into channel regions 1-3, are in rectifying contact with, and completely surround, N+ buried regions 72, 73, 74, 75, 76. N+ buried regions 72-76 are in electrical contact with gates 81-84 through N+ buried region 76 and poly-Si contact 101. Gate oxide layer 77 insulates gates 81-84 from epitaxial layer 52. N+ source regions 57, 58, 59 are formed over, and are in electrical contact with, channel regions 1-3, respectively. Source electrode 110 provides electrical contact to source regions 57-59 and is insulated from gates 81-84 via silicon nitride ($Si_3N_4$) layer 56 and silicon dioxide ($SiO_2$) portions 91, 92, 93, 94. Gate electrode 111 provides electrical contact to gates 81-84. N+ buried region electrode 112, which is shorted to gate electrode 111, provides electrical contact to N+ buried regions 72-76 through poly-Si contact 101 and N+ buried region 76. Passivation layer 120 and drain electrode 130 are also shown.

The operation of the device shown in FIG. 3 will now be described. Typically, source regions 57-59 are grounded and substrate 50, acting as the drain, is at a positive potential with respect to source regions 57-59. With zero gate voltage applied, current will flow through channels 1-3 without any effect from gates 81-84 or P+ and N+ buried regions 67-76. When a positive gate voltage is applied, an electron accumulation layer will form along the walls of channels 1-3, and, hence, increased channel conductivity will result. The reverse biased junctions between multiple N+ buried regions 72-76 and P+ buried regions 67-71 prevent a significant current from flowing between gates 81-84 and channels 1-3, and prevent conductivity modulation of the channels caused by the injection of holes into the channels. The device of FIG. 3 may be formed without N+ buried regions 72-76, and with P+ buried regions 67-71 shorted directly to gates 81-84, however, the positive gate voltage would have to be kept to below the forward bias voltage of the P-N junctions formed by the P+ buried regions and the N− channels. Also, poly-Si gates 81-84 can be of an N− type, thus obviating the need for N+ buried regions 72-76.

If a negative gate voltage is applied to the structure of FIG. 3, the electric field between gates 81-84 and channels 1-3 depletes free electrons from the channels, constricting current flow between source regions 57-59 and substrate 50. This action is similar to that of a JFET. P+ buried regions 67-71 act to sink holes in the channels, thus enabling the j-MOS of FIG. 3 to completely cut-off current upon application of a sufficient negative gate voltage. These P+ buried regions do not necessarily have to be located within each channel. As long as the P+ buried regions are within about 5 mm from channels 1-3, the P+ buried regions will sink virtually all holes from the channels. For example, if a single, P+ buried region was within 2 mm of channels 1-3, the P+ buried region would be sufficient by itself to sink all holes existing in channels -3 when a negative $V_{GS}$ is applied to the gates and to the P+ buried region.

As is apparent from FIG. 3, the conductivity of each channel in the interdigitated structure is controlled by two gates. This allows the channels to have a larger cross-sectional area and have higher conductivity due to the effect of two gates per channel. A cellular structure may also be used wherein each channel is enclosed by a P+ buried region, an N+ buried region, and a gate, but the cellular structure does not allow as much channel region per unit area. However, in some cases a cellular structure is desirable. If a smaller j-MOS transistor is desired, the device of FIG. 3 may be easily modified to reduce the number of gates to two or even one.

Figure 4:
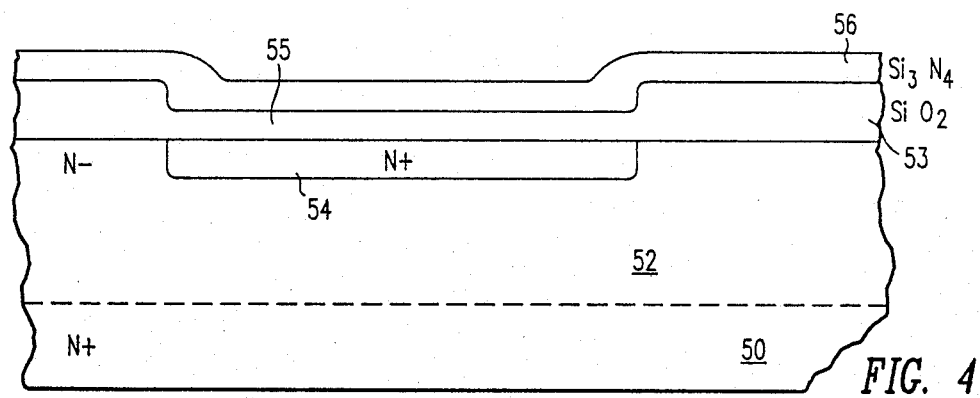
FIGS. 4-13 illustrate the various steps in forming the preferred embodiment.

One method of manufacture of the preferred embodiment of the device shown in FIG. 3 is described hereinbelow. Starting with N+ substrate 50, as shown in FIG. 4, N− epitaxial layer 52 is grown on the upper surface of substrate 50 to a thickness of 3-10 microns and with a resistivity of 0.1-1.5 $\Omega \cdot cm$. The thickness and resistivity of this epitaxial layer largely determines the breakdown voltage and current per unit area characteristics of the j-MOS device and may be calculated using well-known techniques. $SiO_2$ layer 53 is then grown on the surface of the wafer to a thickness of approximately 0.5-1.0 microns. Region 54 is defined and N type dopants are diffused into it. Thin $SiO_2$ layer 55 is then grown on the surface of the wafer to approximately 0.03-0.06 microns in thickness. $Si_3N_4$ layer 56 is next deposited on the surface of the wafer to a thickness of approximately 0.2-0.5 microns. The resulting structure is that of FIG. 4.

Figure 5:
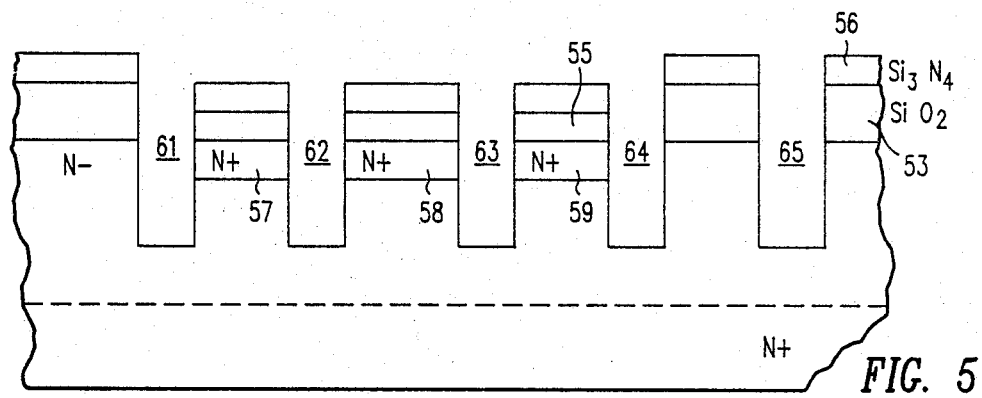

The structure of FIG. 5 is formed using contemporary masking techniques to define the desired channel pattern on the wafer surface and to define the contact region for the subsequently formed buried regions. $Si_3N_4$ layer 56 and $SiO_2$ layers 53, 55 are etched using conventional techniques to expose regions of epitaxial layer 52 where trenches will be etched. Using plasma or reactive ion etching (RIE), trenches 61-65 are etched in epitaxial layer 52 until the bottom of the trenches are approximately halfway between the bottom of N+ source regions 57-59 and the top of substrate 50. Trenches 61-64 will be subsequently filled with poly-Si to form gates and trench 65 will be subsequently filled with poly-Si to form a contact region for the buried regions. The width of trenches 61-64, as measured by the distance between the walls of each trench, is approximately 1-3 microns, and the separation between trenches is approximately 3-6 microns. The length of each trench, as measured by the dimension in and out of the plane of the drawing of FIG. 5, is dependent on the desired current handling capability and on-resistance of the device. Trench 65 is formed in an "L" pattern, which is further explained with reference to FIG. 9, extending out of the plane of the drawing so as to provide contact to the buried regions after a subsequent implantation and drive-in step.

Figure 6:
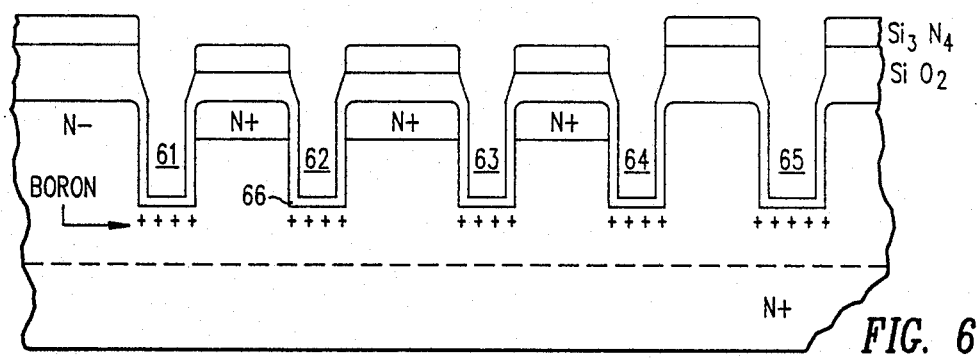

In FIG. 6, the wafer is oxidized to form $SiO_2$ layer 66, approximately 0.05-0.1 microns thick, over the surface of the wafer, including over trenches 61-65. A P type dopant, such as boron, is then implanted with enough energy to embed the dopant into epitaxial layer 52, below trenches 61-65.

Figure 7:
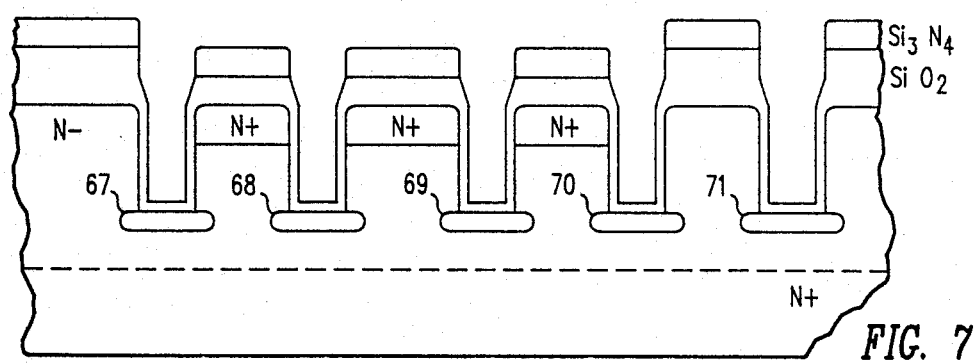

In FIG. 7, the boron is driven-in and diffused both laterally and vertically to obtain P+ buried regions 67-71.

Figure 8:
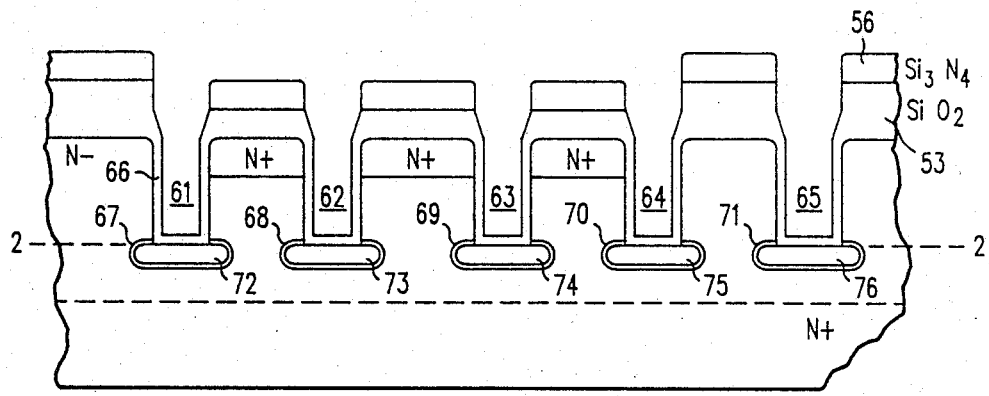

In FIG. 8, a slow diffusing N type dopant, such as arsenic, is implanted into P+ buried regions 67-71 and driven-in to form N+ buried regions 72-76 within P+ buried regions 67-71. This step may be eliminated if it is desired to have P+ buried regions 67-71 in ohmic contact with gates 81-84, or if it is desired to have subsequently formed poly-Si layer 78 be of an N−type so that P+ buried regions 67-71 will be in rectifying contact with gates 81-84.

Figure 9:
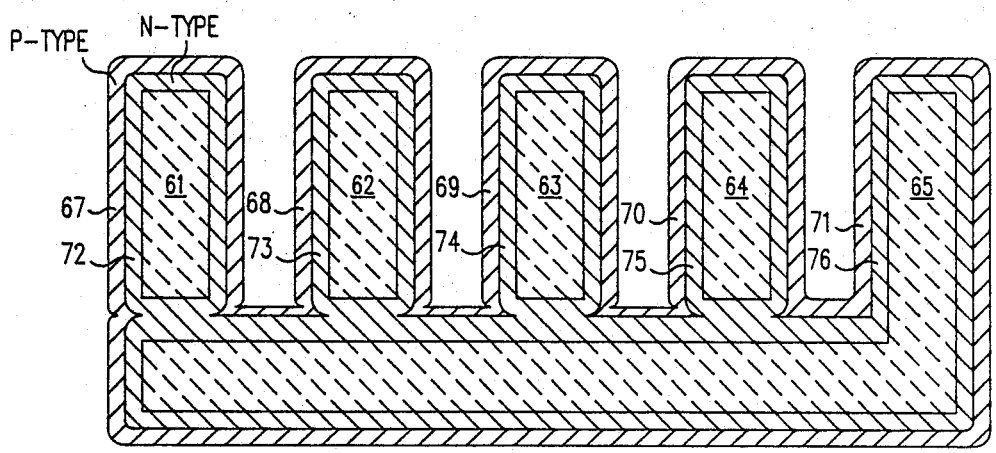

FIG. 9 is a top view of the device shown in FIG. 8 along line 2—2. Trenches 61-65 are shown along with P+ buried regions 67-71 and N+ buried regions 72-76 after drive-in. As seen, trench 65 is formed in an "L" shape. When the P and N type impurities implanted in trench 65 are driven-in, the P type impurities merge with P+ buried regions 67-70, and the N type impurities merge with N+ buried regions 72-75, to form a continuous P+ buried region completely surrounding a continuous N+ buried region. The dashed lines within the trenches indicate that the regions immediately below the trenches are also doped with N type impurities. An electrical contact will eventually be made to N+ buried region 76 within trench 65 in order to short gates 81-84 to N+ buried regions 72-76.

Figure 10:
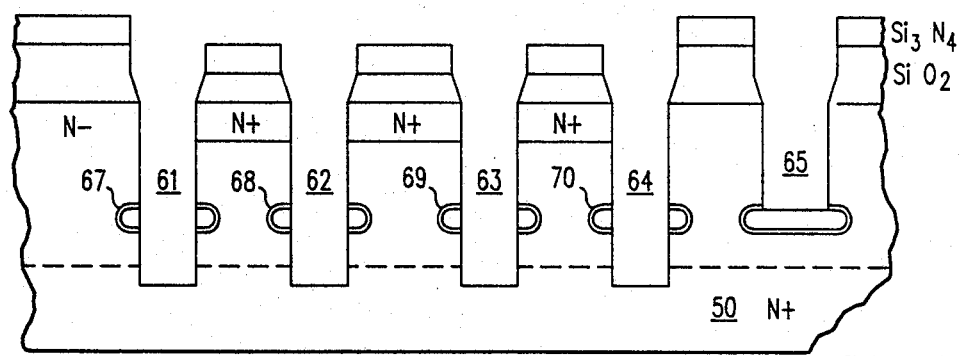

In FIG. 10, SiO$_2$ layer 66 is removed from the surface of the wafer, including from the surfaces of trenches 61-65, and trenches 61-64 are further etched until the trench depths reach down to the underlying N+ substrate 50. P+ buried regions 67-70 now protrude approximately 0.3-1.0 microns into the channel regions between trenches 61-64.

Figure 11:
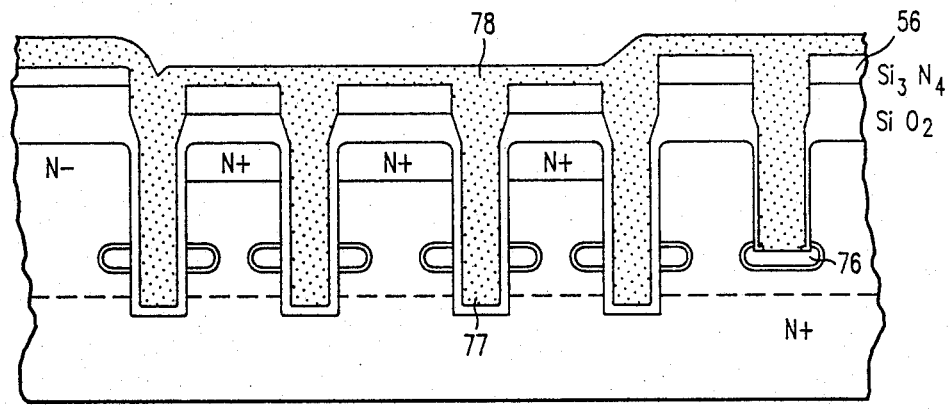

In FIG. 11, gate oxide layer 77, approximately 0.05-0.1 microns thick, is grown over the surface of the wafer, including the bottom and sides of trenches 61-65. A contact hole is made in gate oxide layer 77 in trench 65, and a layer of doped poly-Si 78 is deposited on the surface of the wafer, poly-Si layer 78 being of a thickness to fill trenches 61-65. As seen, poly-Si layer 78 contacts N+ buried region 76 within trench 65. Si$_3$N$_4$ layer 56 is shown being left on the surface, but it may be removed prior to growing gate oxide layer 77.

Figure 12:
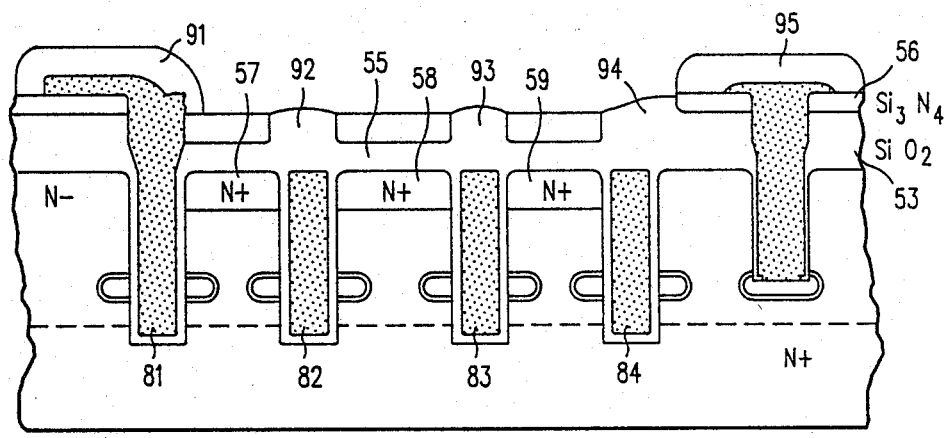

In FIG. 12, poly-Si layer 78 is etched so that gates 81-84 are in electrical contact with each other. The configuration of the poly-Si layer 78 pattern making electrical contact to gates 81-84 is not shown, however, the configuration is easily designed. (Care must be taken to ensure that the poly-Si layer 78 pattern does not interfere with subsequent metallization for electrical contact to source regions 57-59). Poly-Si layer 78 is then oxidized, growing oxide portions 91-95 which are significantly thicker than the original SiO$_2$ layer 55.

Figure 13:
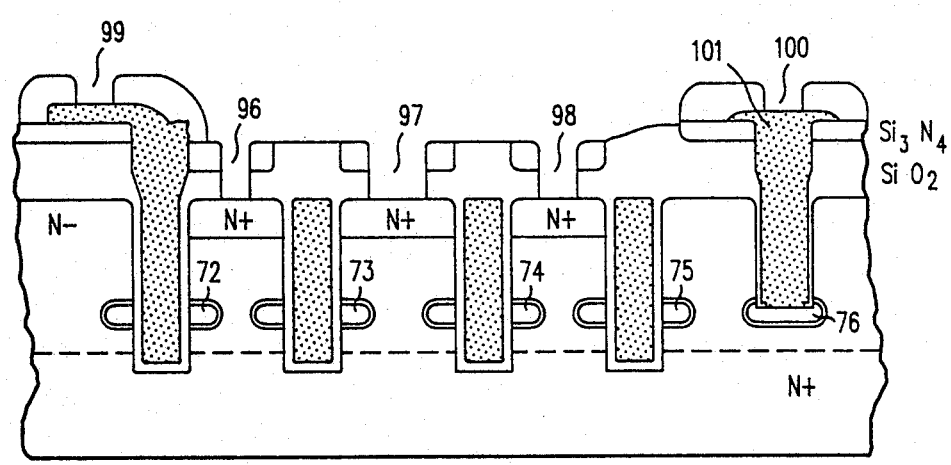

In FIG. 13, well-known masking and etching techniques are used to remove Si$_3$N$_4$ layer 56 and SiO$_2$ layers 53, 55 from over source regions 57-59 to form openings 96-98. This etching step also forms opening 99, exposing a poly-Si gate contact region, and forms opening 100, exposing poly-Si contact 101 for electrically contacting N+ buried regions 72-76.

In FIG. 3, a metallization step forms source electrode 110, gate electrode 111, and N+ buried region electrode 112. Topside passivation layer 120 is then formed, and backside metallization is conducted to form drain contact 130.

The above described structure may of course be formed on a P+ type substrate with all conductivity types being opposite to that previously described. Also, the source and drain regions may be reversed wherein the substrate acts as a source.

The preferred embodiment described above is an improved vertical j-MOS transistor whose dimensions must be calculated by well-known techniques to provide the proper voltage and current characteristics. Where the invention has been particularly shown and described with reference to the preferred embodiment thereof, it will be understood by those skilled in the art that changes in form and detail may be made therein without departing from the spirit and scope of the invention.

We claim:

1. A vertical transistor comprising:
   a highly doped semiconductor substrate of a first conductivity type;
   an epitaxial layer of a first conductivity type overlying said substrate;
   one or more conductive gates insulated from said substrate and said epitaxial layer, each of said one or more gates being embedded fully within said epitaxial layer and partially within said substrate, the portions of said epitaxial layer being depleted by action of said one or more gates forming one or more vertical channels; and
   one or more highly doped regions of a first conductivity type, each overlying a corresponding one of said one or more channels.

2. The vertical transistor of claim 1 further comprising:
   one or more buried regions of a second conductivity type within said epitaxial layer, said one or more buried regions being in electrical contact with said one or more gates and sufficiently proximate to said one or more channels so as to sink minority carriers within said one or more channels.

3. The vertical transistor of claim 2 wherein said epitaxial layer is more lightly doped than said substrate.

4. The vertical transistor of claim 3 wherein said substrate acts as a drain of said transistor, and said one or more highly doped regions o a first conductivity type act as a source of said transistor.

5. The vertical transistor of claim 3 wherein said substrate acts as a source of said transistor and said one or more highly doped region of a first conductivity type act as a drain of said transistor.

6. The vertical transistor of claim 1 further comprising:
   one or more buried regions of a second conductivity type within said epitaxial layer, said one or more buried regions being in rectifying contact with said one or more gates and sufficiently proximate to said one or more channels so as to sink minority carriers within said one or more channels.

7. The vertical transistor of claim 1 further comprising one or more buried regions of a first conductivity type, each within a corresponding buried region of a second conductivity type within said epitaxial layer, said one or more buried regions of a first conductivity type being in electrical contact with said one or more gates, and said one or more buried regions of a second conductivity type being sufficiently proximate to said one or more channels so as to sink minority carriers within said one or more channels.

8. A vertical transistor comprising:

a highly doped semiconductor substrate of a first conductivity type having bottom and top major surfaces;

an epitaxial layer of a first conductivity type overlying said substrate;

a plurality of conductive gates in electrical contact with each other and insulated from said substrate and said epitaxial layer, each of said gates having two major essentially parallel surfaces, said gates being embedded fully within said epitaxial layer and partially within said substrate such that said major parallel surfaces are essentially perpendicular to said major surfaces of said substrate, the portion of said epitaxial layer between facing surfaces of proximate gates forming one or more vertical channels; and one or more highly doped regions of a first conductivity type, each overlying a corresponding one of said channels.

9. The vertical transistor of claim 8 further comprising:

one or more buried regions of a second conductivity type within said epitaxial layer, said one or more buried regions being in electrical contact with said gates and sufficiently proximate to said one or more channels so as to sink minority carriers within said one or more channels.

10. The vertical transistor of claim 9 wherein said epitaxial layer is more lightly doped than said substrate.

11. The vertical transistor of claim 10 wherein said substrate acts as a drain of said transistor and said one or more highly doped regions of a first conductivity type act as a source of said transistor.

12. The vertical transistor of claim 10 wherein said substrate acts as a source of said transistor and said one or more highly doped regions of a first conductivity type act as a drain of said transistor.

13. The vertical transistor of claim 8 further comprising:

one or more buried regions of a second conductivity type within said epitaxial layer, said one or more buried regions being in rectifying contact with said gates and sufficiently proximate to said one or more channels so as to sink minority carriers within said one or more channels.

14. The vertical transistor of claim 9 further comprising one or more buried regions of a first conductivity type, each within a corresponding buried region of a second conductivity type within said epitaxial layer, said one or more buried regions of a first conductivity type being in electrical contat with each other and with said gates and said one or more buried regions of a second conductivity type being sufficiently proximate to said one or more channels so as to sink minority carriers within said one or more channels.

15. The vertical transistor of claim 14 wherein each of said one or more buried regions of a first conductivity type is associated with one of said one or more channels.

16. The vertical transistor of claim 14 wherein each of said one or more buried regions of a first conductivity type is associated with one of said gates and each is approximately bisected by said associated gate.

* * * * *

UNITED STATES PATENT AND TRADEMARK OFFICE
CERTIFICATE OF CORRECTION

PATENT NO. : 4,791,462
DATED : December 13, 1988
INVENTOR(S) : Richard A. Blanchard and Adrian I. Cogan It is certified that error appears in the above-identified patent and that said Letters Patent is hereby corrected as shown below:

Col. 4, line 6, "-3", should read --1-3--.
Col. 6, line 44, "O", should read --of--.
Col. 6, line 48, "region", should read --regions--.
Col. 8, line 20, "contat", should read --contact--.

Signed and Sealed this

Fourth Day of July, 1989

Attest:

DONALD J. QUIGG

Attesting Officer

Commissioner of Patents and Trademarks